United States Patent
Oh et al.

(10) Patent No.: US 7,214,987 B2
(45) Date of Patent: May 8, 2007

(54) SEMICONDUCTOR DEVICE HAVING TWO DIFFERENT OPERATION MODES EMPLOYING AN ASYMMETRICAL BURIED INSULATING LAYER AND METHOD FOR FABRICATING THE SAME

(75) Inventors: Chang-Woo Oh, Gyeonggi-do (KR);
Dong-Gun Park, Gyeonggi-do (KR);
Sung-Young Lee, Gyeonggi-do (KR);
Jeong-Dong Choe, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 23 days.

(21) Appl. No.: 11/011,911

(22) Filed: Dec. 13, 2004

(65) Prior Publication Data

US 2005/0133789 A1 Jun. 23, 2005

(30) Foreign Application Priority Data

Dec. 19, 2003 (KR) .................. 10-2003-0093975

(51) Int. Cl.
*H01L 27/12* (2006.01)
*H01L 27/01* (2006.01)

(52) U.S. Cl. .................. 257/347; 257/349; 257/E29.18; 257/E27.112

(58) Field of Classification Search .............. 257/347, 257/349, E29.18, E27.112
See application file for complete search history.

(56) References Cited

U.S. PATENT DOCUMENTS 6,429,091 B1 8/2002 Chen et al.
6,448,115 B1 9/2002 Bae
6,635,915 B2 * 10/2003 Kokubun .................... 257/301
6,870,225 B2 * 3/2005 Bryant et al. ............... 257/347
2002/0175378 A1 * 11/2002 Choe et al. ................. 257/355
2004/0142534 A1 * 7/2004 Yoo et al. ................... 438/311

FOREIGN PATENT DOCUMENTS

KR 2001-008504 2/2001

OTHER PUBLICATIONS

S. Wolf et al., Silicon Processing for the VLSI Era, 2000, Lattice Press, Second Edition, vol. 1, p. 227.*
English language abstract of Korean Publication No. 2001-008504.

* cited by examiner

*Primary Examiner*—Jerome Jackson
*Assistant Examiner*—Joseph Nguyen
(74) *Attorney, Agent, or Firm*—Marger Johnson & McCollom, P.C.

(57) ABSTRACT

According to some embodiments, a semiconductor device includes a lower semiconductor substrate, an upper silicon pattern, and a MOS transistor. The MOS transistor includes a body region formed within the upper silicon pattern and source/drain regions separated by the body region. A buried insulating layer is interposed between the lower semiconductor substrate and the upper silicon pattern. A through plug penetrates the buried insulating layer and electrically connects the body region with the lower semiconductor substrate, the through plug positioned closer to one of the source/drain regions than the other source/drain region. At least some portion of the upper surface of the through plug is positioned outside a depletion layer when a source voltage is applied to the one of the source/drain regions, and the upper surface of the through plug is positioned inside the depletion layer when a drain voltage is applied to the one region.

24 Claims, 12 Drawing Sheets

SEMICONDUCTOR DEVICE HAVING TWO DIFFERENT OPERATION MODES EMPLOYING AN ASYMMETRICAL BURIED INSULATING LAYER AND METHOD FOR FABRICATING THE SAME

CROSS-REFERENCE TO RELATED APPLICATIONS

This application claims priority from Korean Patent Application No. 2003-93975, filed on 19 Dec. 2003, the disclosure of which is hereby incorporated by reference in its entirety for all purposes.

BACKGROUND OF THE INVENTION

1. Field of the Invention

This disclosure relates to a semiconductor device and method for fabricating the same and, more particularly, to a semiconductor device having two different operation modes employing an asymmetrical buried oxidation layer and method for fabricating the same 2. Description of the Related Art Semiconductor devices employing a discrete device such as a metal oxide semiconductor (MOS) transistor as a switching device are widely used. Since the degree of integration of semiconductor devices is steadily increasing, the size of MOS transistors are correspondingly being scaled down. As a result, shortened channel lengths of the MOS transistors may cause short channel effect (SCE). In order to reduce the SCE, channel ion concentration is inevitably increased. However, the increased channel ion concentration also causes a leakage current to increase. Increased leakage current leads to deterioration of the refresh characteristic of the DRAM device.

In an effort to reduce SCE, research has been conducted for transistors having a silicon-on-insulator (SOI) structure. The SOI structure includes a lower semiconductor substrate, an upper silicon pattern, and a buried insulating layer between them for insulating the lower semiconductor substrate from the upper silicon pattern. Transistors having the SOI structure may reduce the SCE and parasitic capacitance, operate at high speed, and reduce power consumption. However, they allow floating body effects, for example, kink effects, to occur.

To cope with the problems related to floating body effects, various methods have been proposed to electrically connect the upper silicon pattern to the lower semiconductor substrate. For example, a method for electrically connecting the upper silicon pattern to the lower semiconductor substrate is disclosed in U.S. Pat. No. 6,429,091 to Chen et al. ("Chen") entitled "Patterned Buried Insulator."

According to Chen, a mask is formed on a semiconductor substrate to form buried doping regions beneath source/drain regions. After the doping regions are selectively etched, an insulator is filled in the etched portion to form buried insulating layers. A transistor having the source/drain regions positioned on the buried insulating layers is then formed. As a result, patterned buried insulating layers that reduced junction leakage current are formed beneath the source/drain regions. In addition, the transistor is electrically connected to the semiconductor substrate below the buried insulating layer to operate in a body-tied mode, which reduces the floating-body effect.

However, because the semiconductor device fabricated by the method disclosed by Chen operates in the body-tied mode, the on-current and off-current is decreased and increased, respectively, compared to the MOS transistor having the SOI structure.

Embodiments of the invention address these and other disadvantages of the conventional art.

SUMMARY OF THE INVENTION

Some embodiments of the invention provide a semiconductor device capable of increasing the on-current and decreasing the off-current compared to the conventional art while improving the floating-body effect. Other embodiments of the invention provide a DRAM cell capable of preventing the leak current to enhance the refresh characteristic while improving the floating-body effect. Other embodiments of the invention provide a method for fabricating the semiconductor device and the DRAM cell described above.

BRIEF DESCRIPTION OF THE DRAWINGS

The above and other features and advantages of the invention will become more apparent to those of ordinary skill in the art by describing in detail preferred embodiments thereof with reference to the attached drawings that are briefly described below.

DETAILED DESCRIPTION OF THE INVENTION

Figure 1:
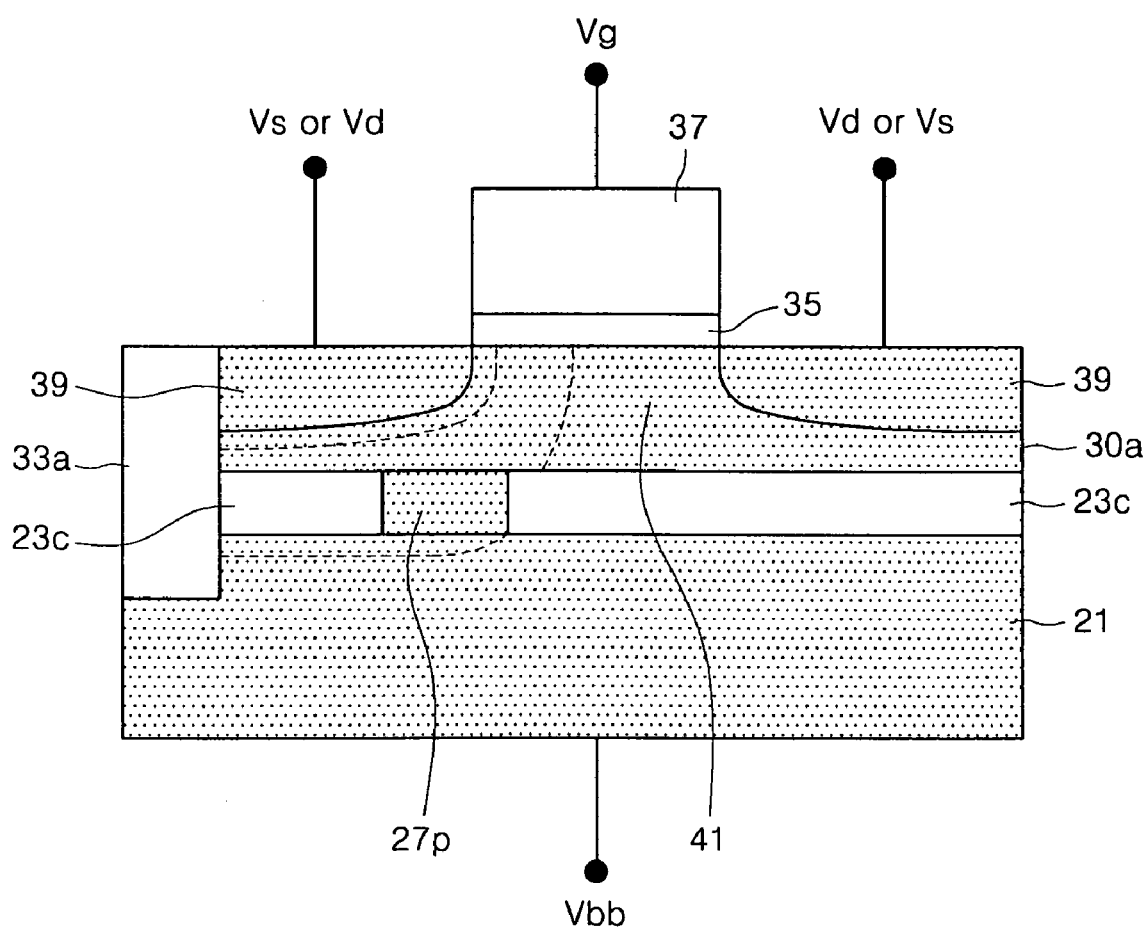
FIG. 1 and FIG. 2 are cross-sectional diagrams illustrating a semiconductor device having two different operation modes in accordance with some embodiments of the invention.

The invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
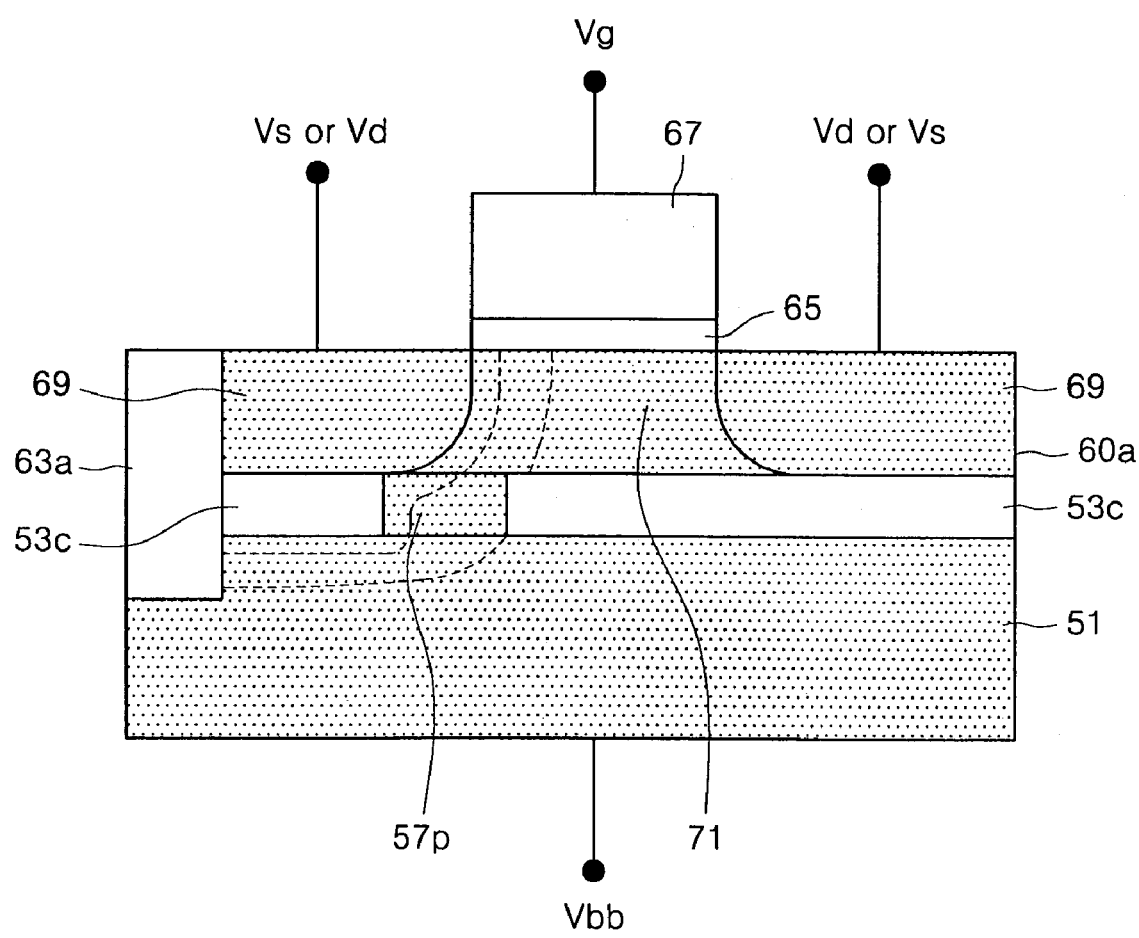
Figure 3:
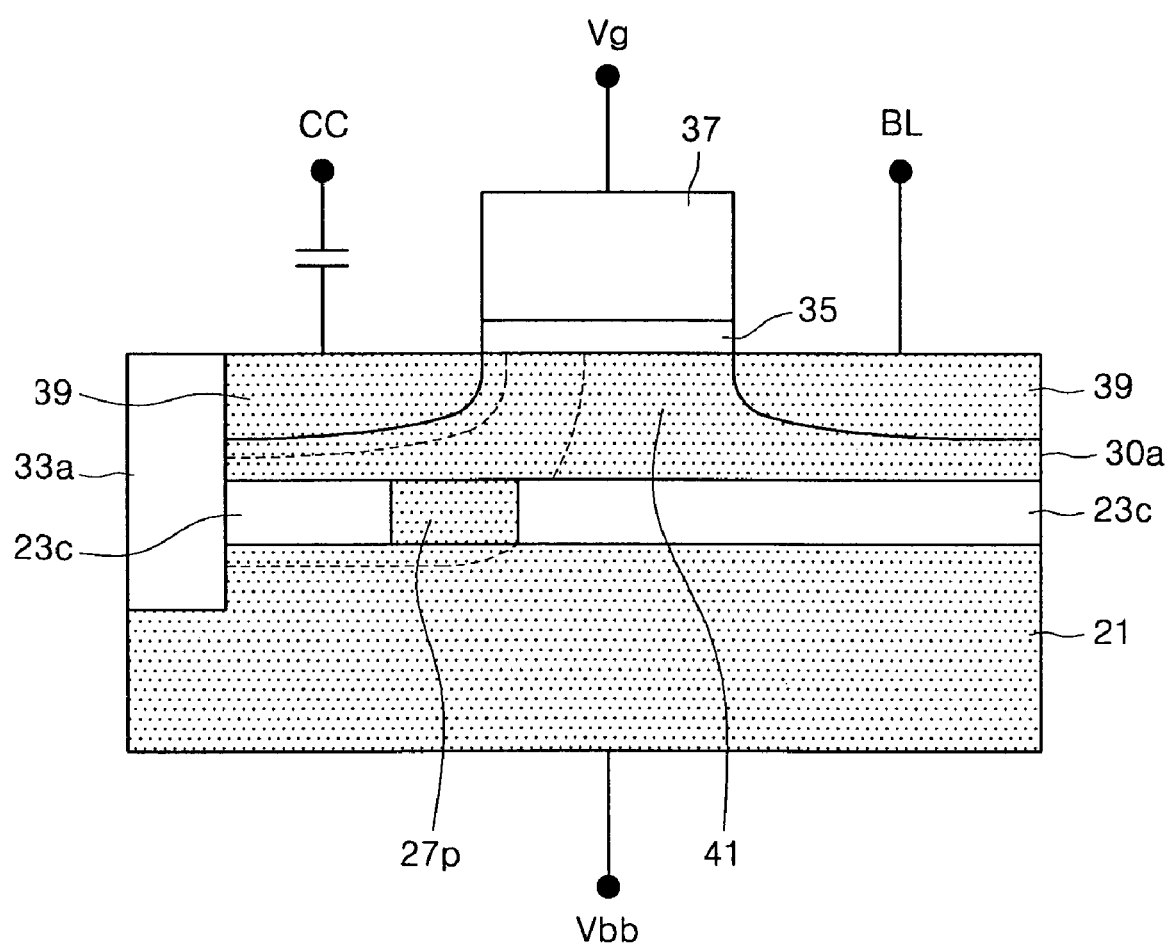
FIG. 3 and FIG. 4 are cross-sectional diagrams illustrating a DRAM cell having two different operation modes in accordance with other embodiments of the invention.
Figure 4:
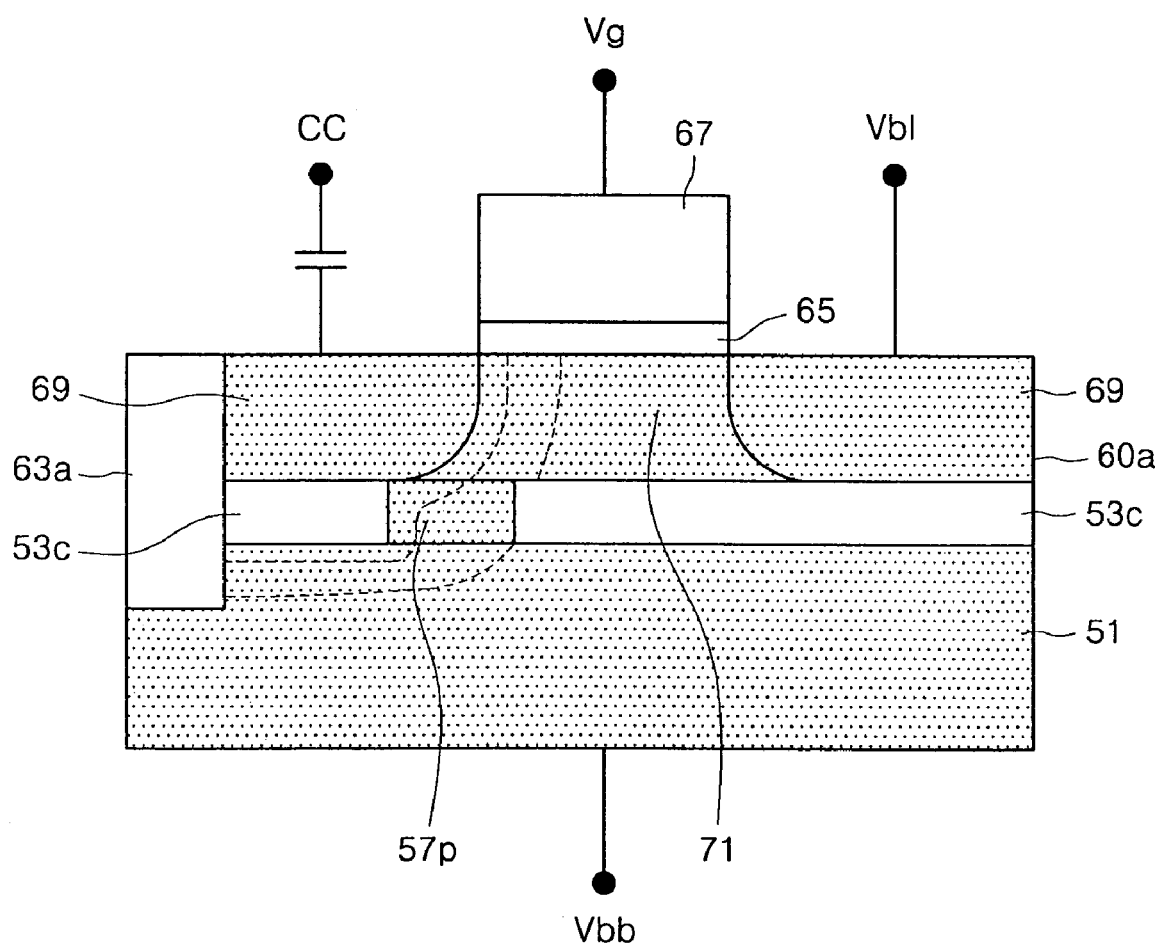

FIG. 1 and FIG. 2 are cross-sectional diagrams illustrating semiconductor devices having two different operation modes in accordance with some embodiments of the invention. FIG. 3 and FIG. 4 are cross-sectional diagrams illustrating a DRAM cell having two different operation modes in accordance with other embodiments of the invention.

Referring to FIG. 1, an upper silicon pattern 30a is positioned above a lower semiconductor substrate 21. The lower semiconductor substrate 21 may be a single crystal silicon substrate. The lower semiconductor substrate 21 has an active area. The active area may be defined by a device isolation layer 33a.

The upper silicon pattern 30a is positioned above the active area of the lower semiconductor substrate 21. The upper silicon pattern 30a may be the same single crystal silicon as the lower semiconductor substrate 21. In other words, the upper silicon pattern 30a may be formed by patterning the single crystal silicon substrate. Alternatively, the upper silicon pattern 30a may be a silicon epitaxial layer. In the meantime, the upper silicon pattern 30a includes a body region 41 and source/drain regions 39 spaced from each other by the body region 41.

A MOS transistor is positioned on the upper silicon pattern 30a. The MOS transistor includes the body region 41, the source/drain regions 39, and a gate electrode 37 positioned on the surface of the body region 41 and insulated from the upper silicon pattern 30a. The gate electrode 37 may be insulated from the upper silicon pattern 30a by a gate insulating layer 35. The MOS transistor may be an NMOS or PMOS transistor. The source/drain regions 39 are regions doped with N type impurity ions when the MOS transistor is an NMOS transistor. Alternatively, the source/drain regions 39 are regions doped with P type impurity ions when the MOS transistor is a PMOS transistor.

A buried insulating layer 23c is interposed between the upper silicon pattern 30a and the lower semiconductor substrate 21. The buried insulating layer 23c may be a silicon oxidation layer or a stacked layer consisting of a silicon oxidation layer and a silicon nitride layer (SiN). Furthermore, the buried insulating layer 23c may include an empty space.

In addition, the buried insulating layer 23c is separated from the source/drain regions 39 by the body region 41. In other words, a neutral region is between the source/drain regions 39 and the buried insulating layer 23c.

In the meantime, a through plug 27p, which penetrates the buried insulating layer 23c, is arranged in proximity to one of the source/drain regions 39. Furthermore, at least some portion of the upper surface of the through plug 27p is positioned outside a depletion layer formed near the one of the source/drain regions 39 when a source voltage Vs is applied to the one of the source/drain regions. In addition, the upper surface of the through plug 27p is positioned inside the depletion layer formed near the one of the source/drain regions 39 when a drain voltage Vd is applied to the one of the source/drain regions. Thus, the MOS transistor operates in a body-tied mode or a body-floated mode when the source and drain voltages are applied, respectively, to the one of the source drain regions.

Preferably, the through plug 27p may be positioned to be defined below the one of the source/drain regions 39. Furthermore, the through plug 27p may be formed of the same material as the upper silicon pattern, namely, the single crystal silicon or the silicon epitaxial layer.

Hereinafter, two different operation modes will be described in detail in accordance with some embodiments of the invention. In this case, the MOS transistor is assumed to be an NMOS transistor. Thus, the source voltage Vs has an electric potential that is lower than that of the drain voltage Vd. If the MOS transistor were a PMOS transistor, the source voltage Vs has an electric potential higher than that of the drain voltage Vd. By explaining the operation mode in the case of a NMOS transistor, those of ordinary skill will also understand the operation mode in the case of a PMOS transistor.

The source region and the drain region are determined by the operating direction of the MOS transistor. Thus, in the case of an NMOS transistor, the source region refers to a region where a ground voltage or low voltage is applied, and the drain region refers to a region where a high voltage is applied. In the case of a PMOS transistor, the source region refers to a region where a high voltage is applied, and the drain region refers to a region where a low voltage is applied. The voltages applied to the source region and drain region are referred to as source voltage and drain voltage, respectively. The source region and the drain region may not be determined before the operating direction of the MOS transistor is determined, so the term "source/drain regions" is used to indicate both regions regardless of their position.

A body-tied mode of operation of the semiconductor device will be described in the following paragraphs.

Referring back to FIG. 1, the source voltage Vs is applied to the source/drain region 39 that is nearest the through plug 27p. In this case, the nearest source/drain region 39 is the source region. Meanwhile, a back bias voltage Vbb is applied to the lower semiconductor substrate 21. The back bias voltage Vbb generally has a negative electric potential. Thus, a reverse bias is applied between the source region 39 and the body region 41 when the source voltage Vs is 0V. However, an absolute value of the back bias voltage Vbb is small so that the reverse bias value is low. As a result, a depletion layer between the source region 39 and the body region 41 becomes thin. In FIG. 1, the dashed line closest to the source region 39 indicates the thin depletion layer. As a result, the through plug 27p is spaced apart from the depletion layer and electrically connects the body region 41 with the lower semiconductor substrate 21. Thus, holes generated in the body region 41 may flow into the lower semiconductor substrate 21, which prevents the floating-body effect from occurring.

In addition, the drain voltage Vd is applied to the other (rightmost) source/drain region 39, and a gate voltage Vg is applied to the gate electrode 37. The MOS transistor turns on when the gate voltage Vg is greater than the threshold voltage Vth. In this case, since the MOS transistor is electrically connected with the lower semiconductor substrate 21 by means of the through plug 27p, it operates in a body-tied mode. Therefore, the occurrence of the floating-body effect may be prevented.

A body-floated mode of operations of the semiconductor device will be described in the following paragraphs.

Referring back to FIG. 1, the drain voltage Vd is applied to the source/drain region 39 closest to the through plug 27p. In this case, the source/drain region 39 nearest the through plug 27p is the drain region. In the meantime, a back bias voltage Vbb is applied to the lower semiconductor substrate 21. The back bias voltage generally has a negative electric potential. Thus, a strong reverse bias is applied between the drain region and the body region 41 by means of the drain voltage Vd and the back bias voltage Vbb. As a result, the width of the depletion layer between the drain region and the body region 41 is increased. The dashed line of FIG. 1 that is significantly apart from the drain region represents the increased depletion layer. As a result, the upper surface of the through plug 27p is included in the depletion layer. Thus, the body region 41 is floated from the lower semiconductor substrate 21. As a result, charges have difficulty in moving from the body region 41 to the lower semiconductor substrate 21, which reduces the leakage current of the source/drain regions 39. This reduction of the leakage current of the source/drain regions 39 leads to reduction of the off-current.

In addition, the source voltage Vs is applied to the other source/drain region 39, and a gate voltage Vg is applied to the gate electrode 37. The MOS transistor turns on when the gate voltage Vg is greater than the threshold voltage Vth. In this case, the body region 41 is floated from the lower semiconductor substrate 21. Thus, the MOS transistor operates in a body-floated mode. As a result, the on-current of the MOS transistor increases.

In the meantime, holes may accumulate in the body region 41 while the MOS transistor operates in the body-floated mode. However, the accumulated holes may be removed when the MOS transistor operates in the body-tied mode. In other words, the body-tied mode operation and the body-floated mode operation may be combined, thereby improving the floating-body effect of the MOS transistor while increasing the on-current and decreasing the off-current.

FIG. 2 is a cross-sectional diagram illustrating the operation of another semiconductor device in accordance with some embodiments of the invention.

Referring to FIG. 2, and similar to what was described with reference to FIG. 1, an upper silicon pattern 60a and a MOS transistor are positioned above a lower semiconductor substrate 51 having an active area. The active area may be limited by a device isolation layer 63a.

Similar to what was described with reference to FIG. 1, the upper silicon pattern 60a may be a single crystal silicon or silicon epitaxial layer. The upper silicon pattern 60a includes a body region 71, and source/drain regions 69 spaced from each other by the body region 71.

Similar to what was described with reference to FIG. 1, the MOS transistor includes the body region 71, the source/drain regions 69, and a gate electrode 67 positioned on the surface of the body region 71 and insulated from the upper silicon pattern 60a. Furthermore, the MOS transistor may be an NMOS or PMOS transistor.

Similar to what was described with reference to FIG. 1, a buried insulating layer 53c is interposed between the upper silicon pattern 60a and the lower semiconductor substrate 51.

The buried insulating layer 53c is in contact with the source/drain regions 69. In other words, there is no neutral region between the source/drain regions 69 and the buried insulating layer 53c. Thus, the transistor of FIG. 2 is known as a Fully Depleted SOI (FDSOI) MOSFET.

The through plug 57p, which penetrates the buried insulating layer 53c, is positioned in proximity to one of the source/drain regions 69. In addition, at least some portion of the upper surface of the through plug 57p is positioned outside the depletion layer formed near the one of the source/drain regions 69 when a source voltage Vs is applied to the one of the source/drain regions 69 as described with reference to FIG. 1. In addition, the upper surface of the through plug 57p is positioned inside the depletion layer formed near the one of the source/drain regions 69 when a drain voltage Vd is applied to the one of the source/drain regions 69. As a result, similar to what was described with reference to FIG. 1, the MOS transistor of FIG. 2 may operate in a body-tied mode or a body-floated mode. Since these body-tied mode and body-floated mode operations are the same as described with reference to FIG. 1, a duplicative description is omitted.

FIG. 3 is a cross-sectional diagram illustrating a DRAM cell having two different operation modes in accordance with other embodiments of the invention.

Referring to FIG. 3, a lower semiconductor substrate 21, a buried insulating layer 23c, an upper silicon pattern 30a, a MOS transistor, and a through plug 27p are arranged in a similar manner as what was described with reference to FIG. 1. In addition, a device isolation layer 33a, source/drain regions 39, and body region 41 are also arranged in the same manner as FIG. 1. Thus, the through plug 27p is positioned in close proximity to one of the source/drain regions 39, in particular, the source/drain region 39 on the left-hand side of FIG. 3. An NMOS transistor is generally employed for the DRAM cell, so that the MOS transistor is defined as the NMOS transistor in this case.

In the meantime, a cell capacitor CC is electrically connected with the one of the source/drain regions 39. The cell capacitor CC acts to store charges in the DRAM cell. In addition, a bit line BL is electrically connected with the other one of the source/drain regions 39, in particular, the source/drain region on the right-hand side of FIG. 3. The bit line acts to deliver information.

Hereinafter, with reference to FIG. 3, two different operation modes will be described in detail with respect to program, reading, and refresh operations.

First, in the case of the program operation, a high voltage Vcc is applied to the bit line BL, and a gate voltage Vg higher than the threshold voltage Vth is applied to the gate electrode 37. As a result, the MOS transistor turns on. In the meantime, the voltage Vbb having a negative electric potential is applied to the lower semiconductor substrate 21. When the cell capacitor CC does not store the charges, the electric potential of a lower electrode of the cell capacitor is 0V. As a result, the MOS transistor operates in a body-tied mode. In this case, electrons move from the left-hand source/drain region 39 to the right-hand source/drain region 39. These electrons and silicon lattices of the body region 41 impact each other to generate holes in the body region 41 due to impact ionization. However, these holes flow into the lower semiconductor substrate 21 via the through plug 27p.

In the meantime, the cell capacitor stores the charges when the program operation is completed. As a result, the lower electrode of the cell capacitor CC has a high electric potential Vcc. Thus, the MOS transistor operates in a body-floated mode. When the MOS transistor is in the body-floated mode, the off-current is decreased as described with reference to FIG. 1. As a result, the leakage current of the cell capacitor CC decreases to enhance the charge retention capacity.

Next, in the case of a reading operation, a low voltage is applied to the bit line BL, and a gate voltage Vg higher than the threshold voltage Vth is applied to the gate electrode 37. As a result, the MOS transistor turns on. The voltage Vbb is applied to the lower semiconductor substrate 21. In the meantime, the lower electrode of the cell capacitor CC has the electric potential of Vcc when the cell capacitor CC stores the charges. Thus, the MOS transistor operates in the body-floated mode. In this case, electrons move from the right-hand source/drain region 39 to the left-hand source/drain region 39. The silicon lattices of the body region 41 are impacted by these electrons to generate holes. These holes are then accumulated within the body region 41.

When the reading operation is completed, the lower electrode of the cell capacitor CC has the electric potential of 0V. As a result, the MOS transistor switches to the body-tied mode. Thus, the accumulated holes flow into the lower semiconductor substrate 21. In other words, all holes that are generated within the body region 41 during the reading operation may flow into the lower semiconductor substrate 21.

The electrons do not move between the left-hand source/drain region 39 and the right-hand source/drain region 39 when the cell capacitor CC does not store the charges, so the floating body effect does not occur.

In the meantime, the refresh operation follows the reading and program operations. In other words, the refresh operation performs a reading operation to read information stored in the cell capacitor CC and then programs the same information in the cell capacitor CC. Thus, holes may be accumulated in the body region 41 while the reading operation is performed. However, these holes flow into the lower semiconductor substrate 41 when the reading operation is completed. The program operation is then performed in the body-tied mode. Thus, holes may be prevented from accumulating in the body region 41. In the meantime, when the program operation is completed to store the charge in the cell capacitor CC, the MOS transistor transitions to the body-floated mode to decrease the off-current. As a result, the DRAM cell may prevent leakage current, thereby enhancing the refresh characteristics while improving the floating-body effect.

FIG. 4 is a cross-sectional diagram illustrating another DRAM cell in accordance with other embodiments of the invention.

Referring to FIG. 4, a lower semiconductor substrate 51, a buried insulating layer 53c, an upper silicon pattern 60a, a MOS transistor, and a through plug 57p are the same as those described with reference to FIG. 2. In addition, a device isolation layer 63a, source/drain regions 69, and a body region 71 are also the same as those described with reference to FIG. 2. Thus, the through plug 57p is positioned close to one of the source/drain regions 69. Since an NMOS transistor is generally employed for the DRAM cell, the MOS transistor is defined as the NMOS transistor in this case.

A cell capacitor CC is electrically connected with the one of the source/drain regions 69, and in particular, the left-hand source/drain region 69. The cell capacitor CC acts to store charges in the DRAM cell. In addition, a bit line BL is electrically connected with the other region. The bit line acts to deliver information.

Operation of the DRAM cell is the same as the DRAM cell illustrated in FIG. 3, so a duplicative description is omitted.

Hereinafter, a method for fabricating a semiconductor device in accordance with an exemplary embodiment of the invention will be described.

Figure 5:
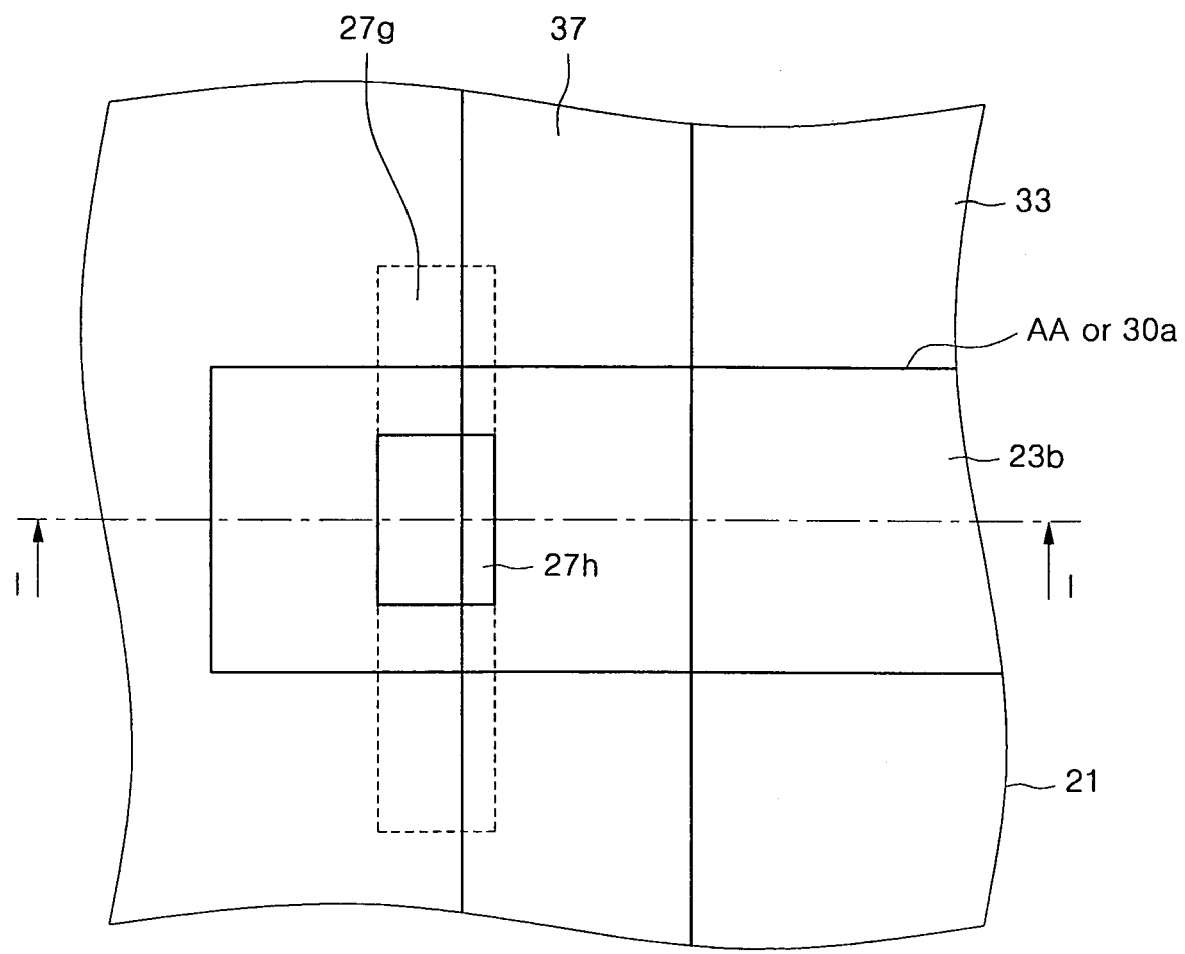
FIG. 5 is a partial layout diagram illustrating a method for fabricating a semiconductor device having two different operation modes in accordance with some other embodiments of the invention.

FIG. 5 is a partial layout diagram illustrating a semiconductor device having two different operation modes in accordance with some embodiments of the invention. FIG. 6 to FIG. 14 are cross-sectional diagrams taken along the line I—I of FIG. 5 illustrating a method of fabricating the semiconductor device of FIG. 5 in accordance with some embodiments of the invention.

Figure 6:
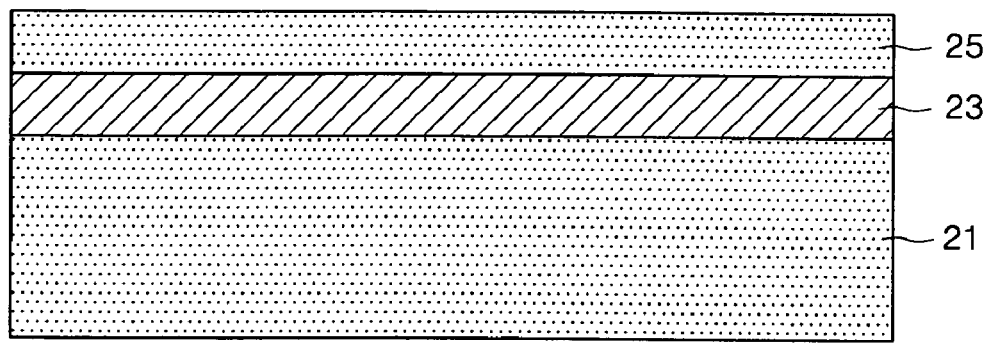
FIG. 6 to FIG. 14 are cross-sectional diagrams taken along the line I—I of FIG. 5 that further illustrate the method of FIG. 5.

Referring to FIG. 5 and FIG. 6, a sacrificial layer 23 is formed on the lower semiconductor substrate 21. The lower semiconductor substrate 21 may be a single crystal silicon substrate. In the meantime, the sacrificial layer 23 is formed of material that has a lattice constant close to or same as that of silicon. Preferably, the sacrificial layer 23 may be a SiGe epitaxial layer of about 10 nm to 200 nm in thickness. A lower silicon epitaxial layer 25 may be formed on the sacrificial layer 23. The lower silicon epitaxial layer 25 prevents the upper surface of the sacrificial layer 23 from being exposed during a subsequent process.

Figure 7:
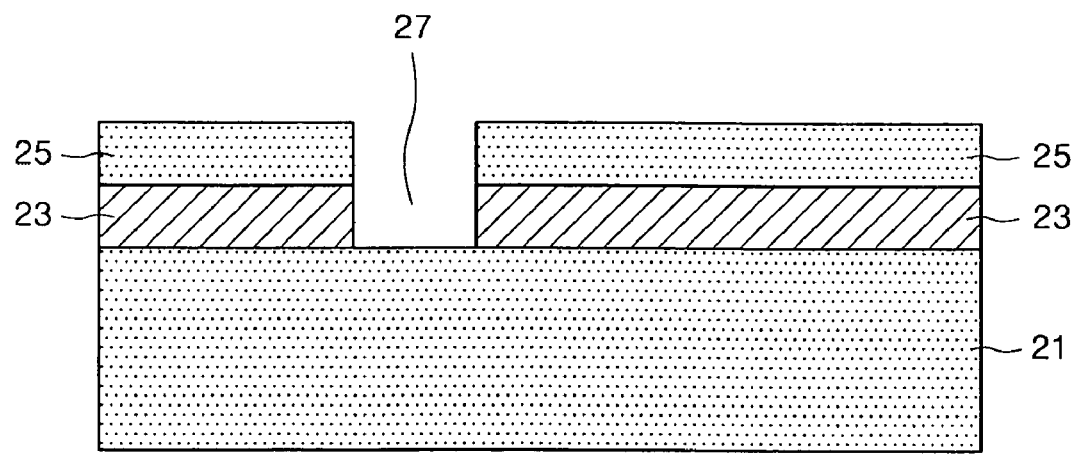

Referring to FIG. 5 and FIG. 7, the lower silicon epitaxial layer 25 and the sacrificial layer 23 are patterned to form an opening 27 for exposing the lower semiconductor substrate 21. A hard mask layer (not shown) may be formed on the lower silicon epitaxial layer 25 in order to form the opening 27. The hard mask layer is patterned to form a hard mask pattern having an opening for exposing the lower silicon epitaxial layer 25. The lower silicon epitaxial layer 25 and the sacrificial layer 23 are then sequentially etched using the hard mask pattern as an etch mask, thereby forming the opening 27 for exposing the lower semiconductor substrate 21. The hard mask pattern is then removed.

The opening 27 may be a groove 27g or a hole 27h as shown in FIG. 5. The sacrificial layer 23 and the lower silicon epitaxial layer 25 are exposed on the side wall of the opening 27.

Figure 8:
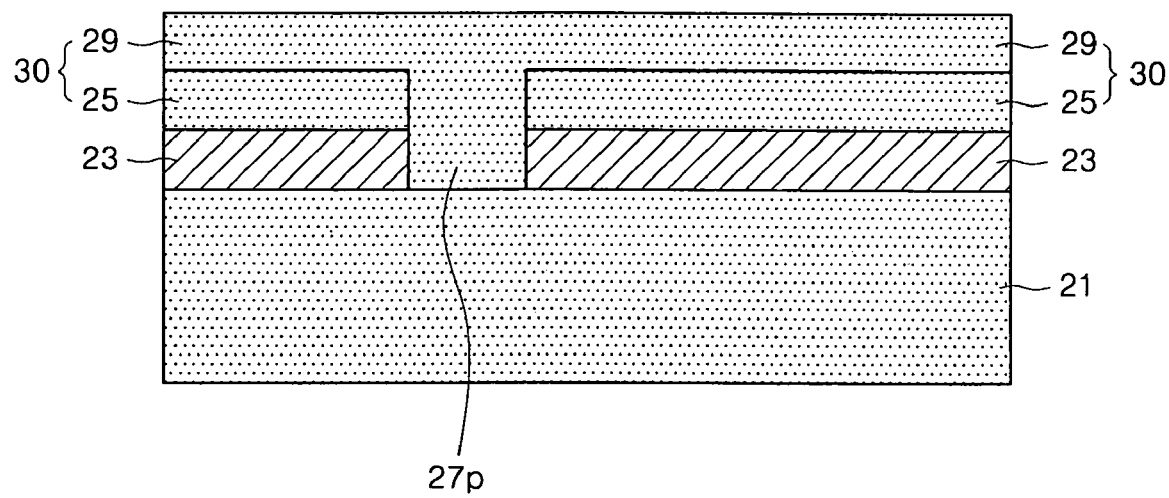

Referring to FIG. 5 and FIG. 8, an upper silicon epitaxial layer 29 is formed on the semiconductor substrate where the opening 27 is already formed. The upper silicon epitaxial layer 29 fills the opening 27 on the exposed lower semiconductor substrate 21, and covers the upper surface of the lower silicon epitaxial layer 25. When the sacrificial layer 23 is formed of the SiGe epitaxial layer, the upper silicon epitaxial layer 29 may be uniformly formed on the SiGe epitaxial layer. Thus, a defect-free silicon epitaxial layer may be formed within the opening 27. As a result, a through plug 27p that fills the opening 27 is formed.

The silicon epitaxial layers 25 and 29 formed on the sacrificial layer 23 may be defined as an upper silicon substrate 30.

Figure 9:
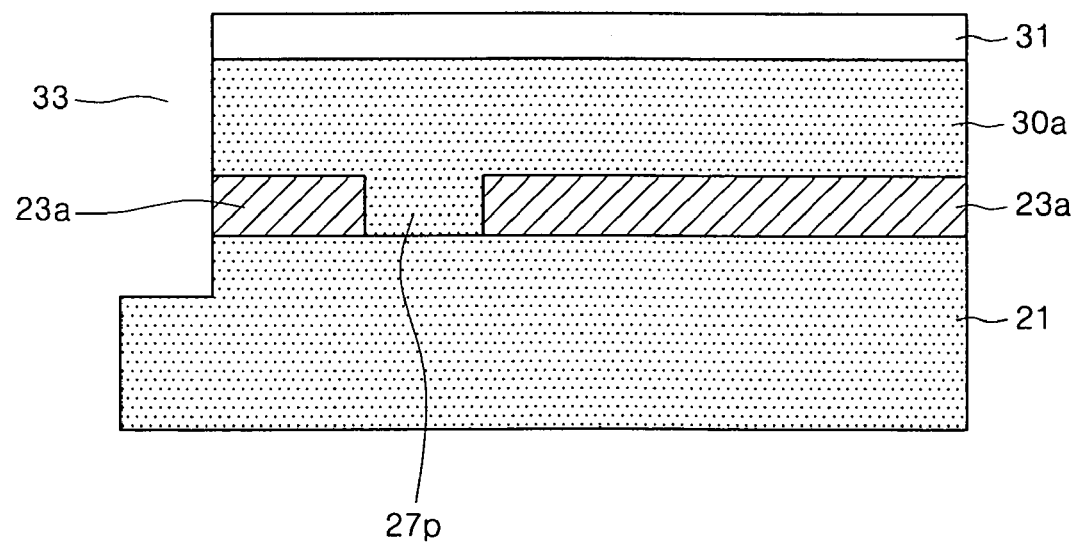

Referring to FIG. 5 and FIG. 9, the upper silicon substrate 30, the sacrificial layer 23, and the lower semiconductor substrate 21 are sequentially patterned to form a trench 33 for defining an active area AA of the lower semiconductor substrate 21. The active area AA includes at least some portion of the lower semiconductor substrate 21 exposed in the opening 27. In the meantime, a patterned sacrificial layer 23a and an upper silicon pattern 30a are formed on the active area AA while the trench 33 is formed. The patterned sacrificial layer 23a is exposed on the side wall of the trench 33.

Preferably, a hard mask pattern 31 may be formed in order to form the trench 33. The upper silicon substrate 30, the sacrificial layer 23, and the lower semiconductor substrate 21 are etched using the hard mask pattern 31 as an etch mask to form the trench 33.

Figure 10:
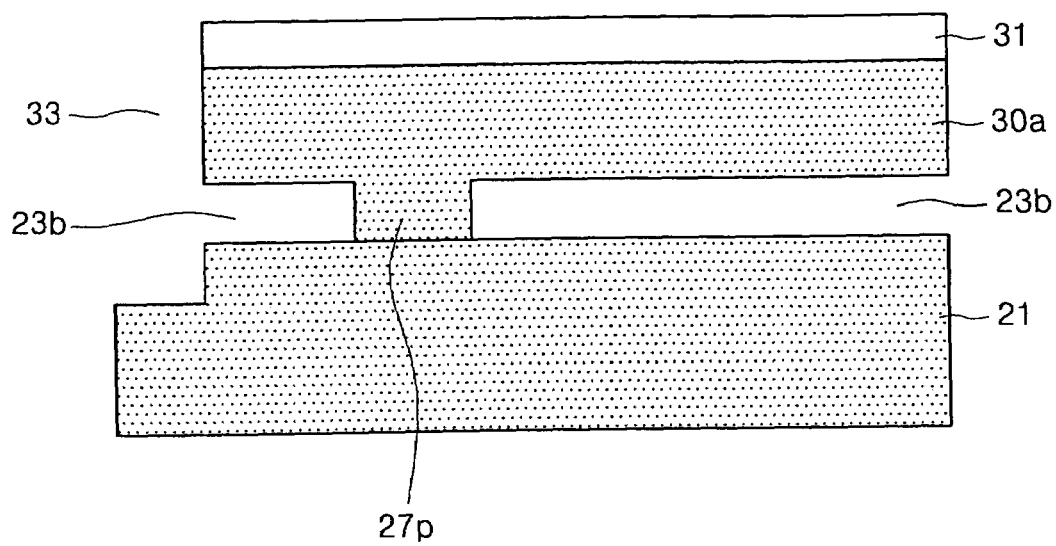

Referring to FIG. 5 and FIG. 10, the patterned sacrificial layer 23a is removed through selective etching. It may be selectively etched using a wet etch process. An empty space 23b is formed when the patterned sacrificial layer 23a is removed.

Figure 11:
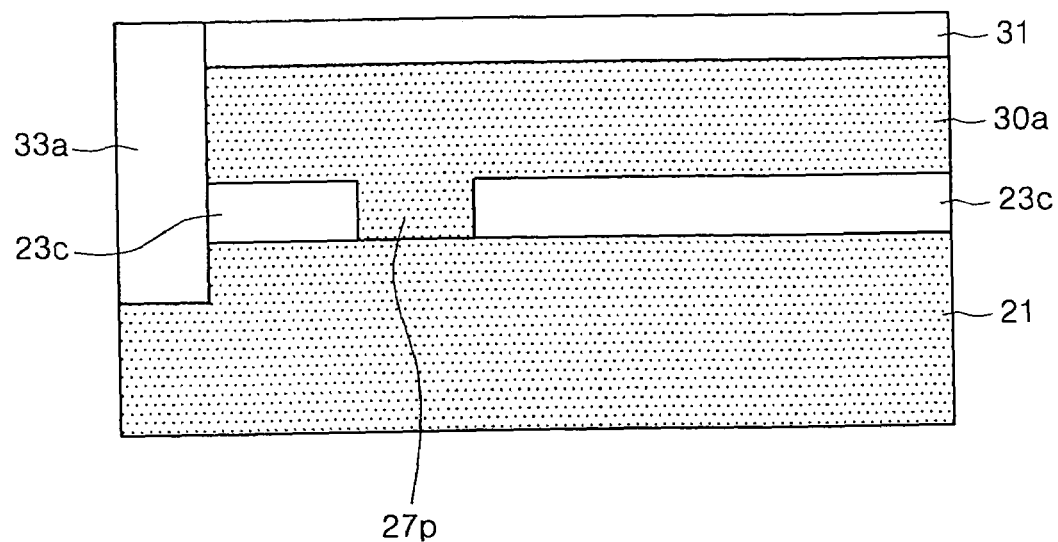

Referring to FIG. 5 and FIG. 11, a buried insulating layer 23c is formed in the empty space 23b that was previously occupied by the patterned sacrificial layer 23a. The buried insulating layer 23c may be formed of empty spaces, a silicon oxidation layer, or a silicon nitride layer, or it may be formed to have a stacked structure that includes more than one of those elements. Preferably, a silicon oxidation layer is formed to cover the inner wall of the empty space 23b, followed by a silicon nitride layer. As a result, the buried insulating layer 23c has a structure consisting of a silicon oxidation layer surrounded by a silicon oxidation layer. Furthermore, an insulating layer may be formed on the inner wall of the trench 33. An insulating layer is then formed to fill the trench 33 and is planarized until the upper surface of the hard mask pattern 31 is exposed to form a device isolation layer 33a that fills the trench 33. The device isolation layer 33a covers side walls of the upper silicon pattern 30a and the buried insulating layer 23c. In this case, the hard mask pattern 31 acts to protect the upper surface of the upper silicon pattern 30a.

After the empty spaces 23b are formed, the device isolation layer 33a may also be formed without filling the empty spaces 23b. In this case, a high temperature oxidation layer may preferably be formed on side walls of the empty spaces 23b and the trench 33 before the device isolation layer 39 is formed. The high temperature oxidation layer protects side wall surfaces of the empty spaces 23b and trench 33. As a result, the buried insulating layer 23c includes an empty space.

Figure 12:
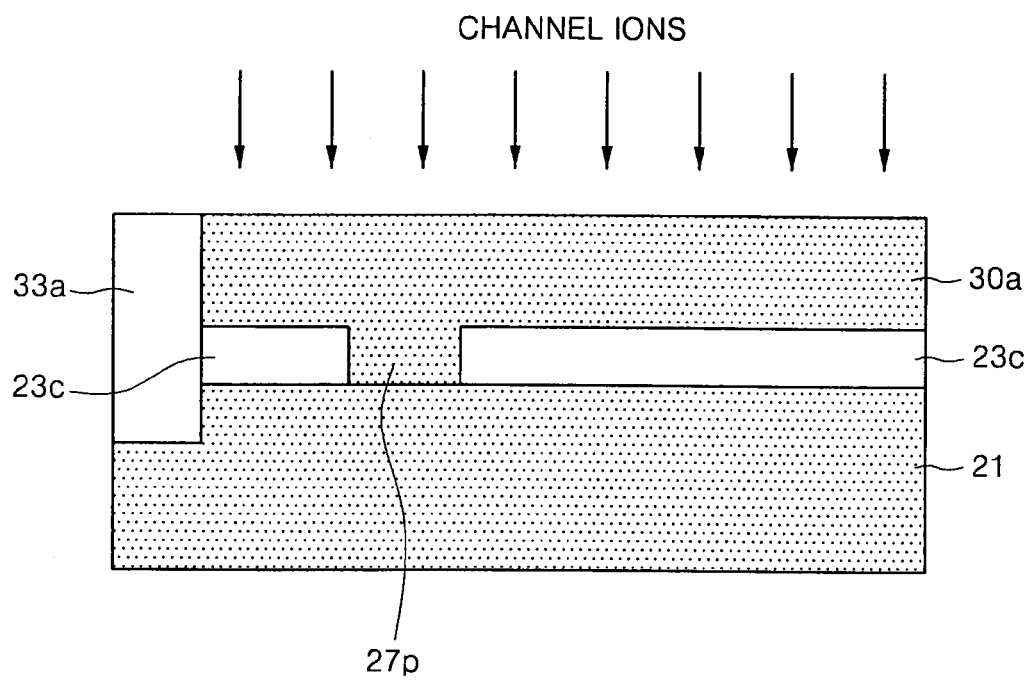

Referring to FIG. 5 and FIG. 12, the hard mask pattern 31 is removed after the device isolation layer 33a is formed. Channel ions may be then implanted into the upper silicon pattern 30a. These channel ions may be implanted so as to adjust the threshold voltage. The channel ions implanted into the silicon pattern 30a may diffuse into the lower semiconductor substrate 21 via the through plug 27p while a subsequent thermal treatment is performed. The subsequent thermal treatment may be performed right after the channel ions are implanted. Alternatively, the thermal treatment may also be performed after other impurity ions are implanted. As a result, the upper silicon pattern 30a above the through plug 27p contains a lower concentration of channel than the upper silicon pattern 30a above the buried insulating layer 23c.

Figure 13:
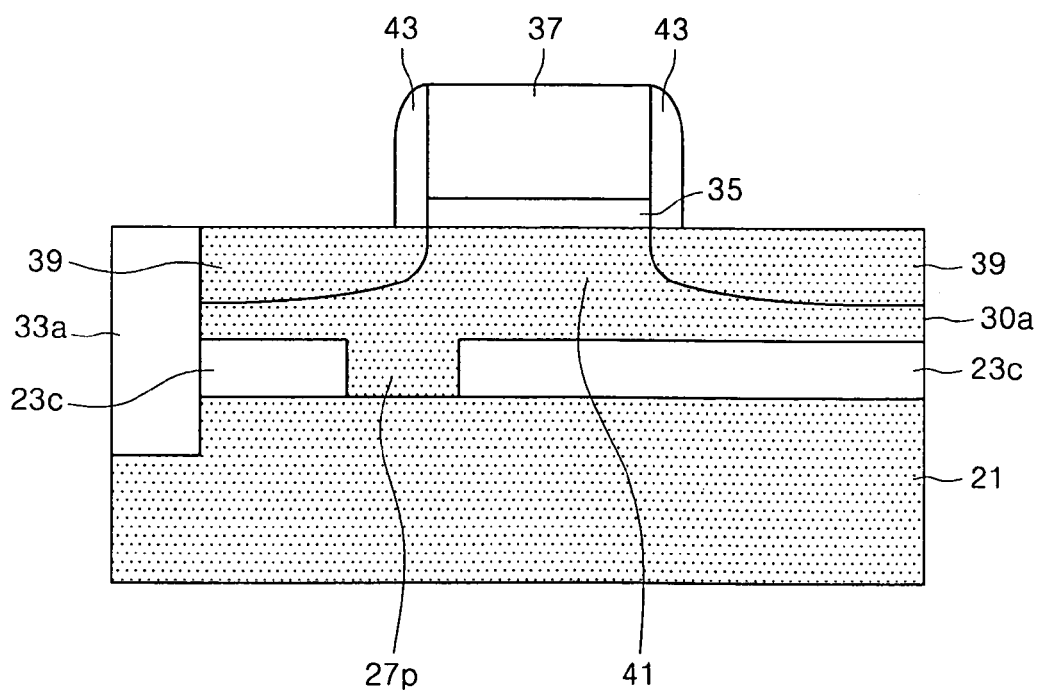

Referring to FIG. 5 and FIG. 13, a gate electrode 37 is formed on the semiconductor substrate where the channel ions were implanted, across the upper silicon pattern 30a and insulated from the same. The gate electrode 37 may be insulated from the upper silicon pattern 30a by the gate insulating layer 35. In addition, the gate electrode 37 is arranged across the upper silicon pattern 30a so that one side wall is closer to the center of the through plug 27p than the other side wall.

N type or P type impurity ions are implanted into the upper silicon pattern 30a using the gate electrode 37 as an ion implanting mask to form source/drain regions 39. In other words, N type impurity ions are implanted to form a NMOS transistor, and P type impurity ions are implanted to form a PMOS transistor. As a result, one of the source/drain regions 39 is formed closer to the through plug 27p than the other source/drain region 39. The impurity ions used to from the source/drain regions 39 have a type opposite that of the channel ions.

The source/drain regions 39 may also be formed using the conventional lightly doped drain (LDD) process. In other words, impurity ions are implanted using the gate electrode 37 as an ion implanting mask to form lightly doped impurity regions. Spacers 43 are then formed to cover the side wall of the gate electrode 37, and impurity ions are implanted using the spacers 43 and the gate electrode 37 as an ion implanting mask to form highly doped impurity regions.

The source/drain regions 39 may be formed to have a junction depth that is smaller than the thickness of the upper silicon pattern 30a. In other words, there is a neutral region of the upper silicon pattern 30a between the source/drain regions 39 and the buried insulating layer 23c. In this case, a body region 41 includes a region between the source/drain regions 39, and a region between the source/drain regions and the buried insulating layer 23c. The gate electrode 37 may be formed across the upper portion of the buried insulating layer 23c around the through plug 27p. As a result, the through plug 27p is positioned below one of the source/drain regions 39. In other words, the through plug 27p may be spaced from the lower portion of the junction edge close to the gate electrode 37. In general, a strong electric field is generated at the junction edge close to the gate electrode. As a result, the junction edge has many leakage currents. However, according to these embodiments, the through plug 27p is spaced from the junction edge to reduce the leakage current.

Alternatively, the source/drain regions 39 may be formed to have the same junction depth as the thickness of the upper silicon pattern 30a. In other words, there may be no neutral region between the source/drain regions 39 and the buried insulating layer 23c. In this case, the body region 41 includes the region between the source/drain regions 39. The gate electrode 37 crosses over at least some portion of the through plug 27p.

The MOS transistor is formed of the gate electrode 37, the source/drain regions 39, and the body region 41. The body region 41 is electrically connected with the lower semiconductor substrate 21 via the through plug 27p. In addition, the MOS transistor operates in the body-tied mode or the body-floated mode when the source voltage and drain voltage are applied, respectively, to the source/drain region 39 closest to the through plug 27p.

The channel ions have a low concentration near the left-hand source/drain region 39, and a high concentration near the right-hand source/drain region 39. As a result, the threshold voltage is adjusted by the channel ions near the right-hand source/drain region 39. Since the concentration of the channel ions near the left-hand source/drain region 39 is low, it is easy to adjust the width of the depletion layer, which ensures a sufficient process margin for forming the MOS transistor.

Figure 14:
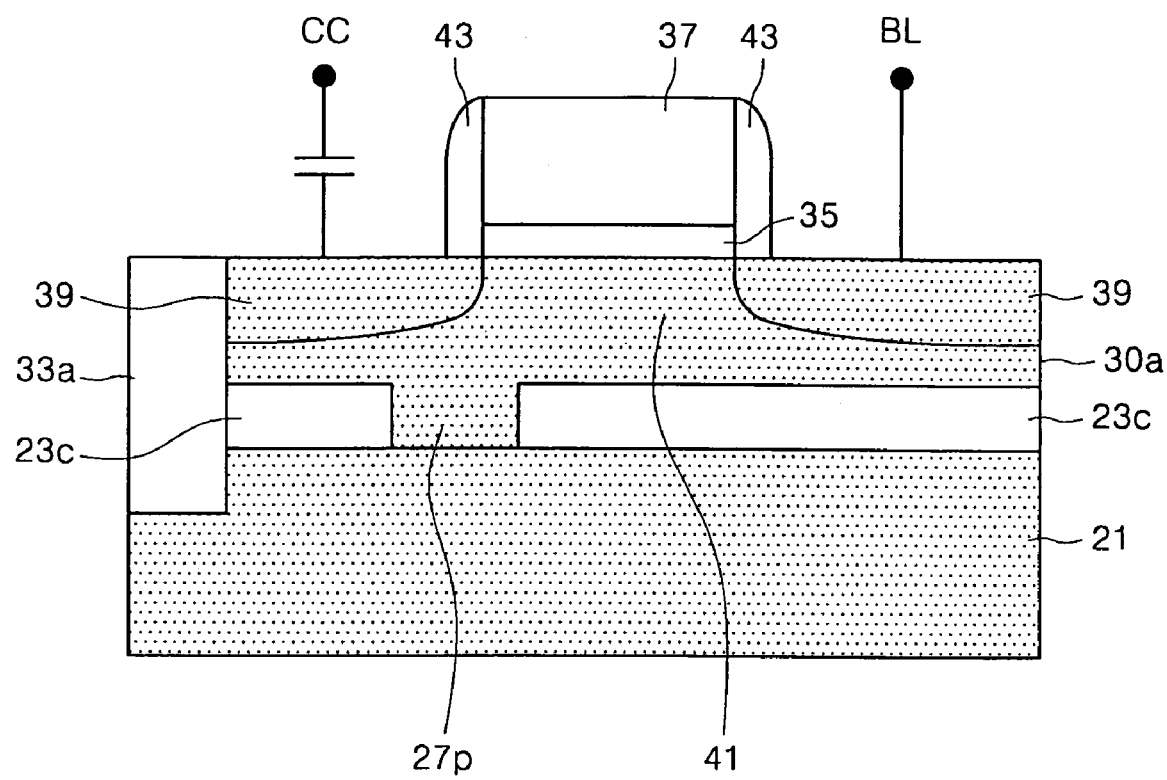

Referring to FIG. 5 and FIG. 14, an interlayer insulating layer (not shown) is formed on the semiconductor over the source/drain regions 39. A bit line BL is formed to penetrate through the interlayer insulating layer and electrically connect with the right-hand source/drain region 39. In addition, cell capacitors CC are formed to electrically connect with the left-hand source/drain region 39, which results in a DRAM cell capable of operating in the body-tied mode or the body-floated mode.

FIG. 15 to FIG. 19 are cross-sectional diagrams illustrating a method of fabricating a semiconductor device in accordance with still other embodiments of the invention.

Figure 15:
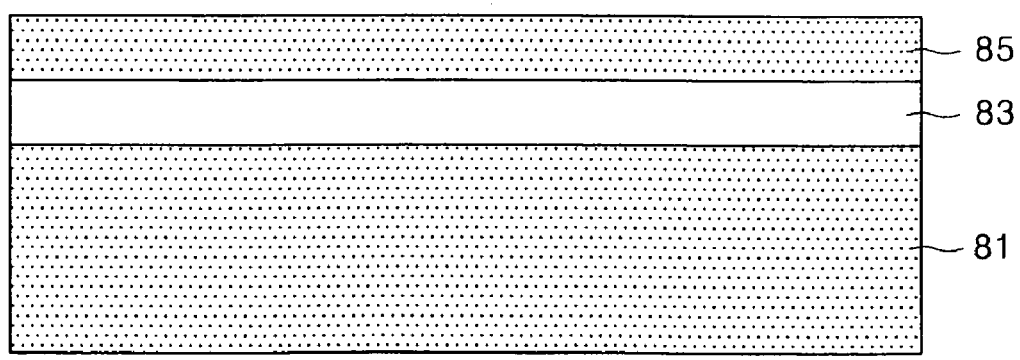
FIG. 15 to FIG. 19 are cross-sectional diagrams illustrating a method for fabricating a semiconductor device in accordance with still other embodiments of the invention.

Referring to FIG. 15, a lower semiconductor substrate 81, a buried insulating layer 83, and a lower silicon layer 85 are sequentially stacked to form an SOI substrate. The SOI substrate may be formed using the typical method. For example, the SOI substrate may be formed by implanting oxygen ions into the silicon substrate and performing thermal treatment on the silicon substrate where the oxygen ions are already implanted, or using a method for joining silicon substrates and then cutting them, or sequentially stacking the buried insulating layer 83 and the lower silicon layer 85 on the lower semiconductor substrate 81.

Figure 16:
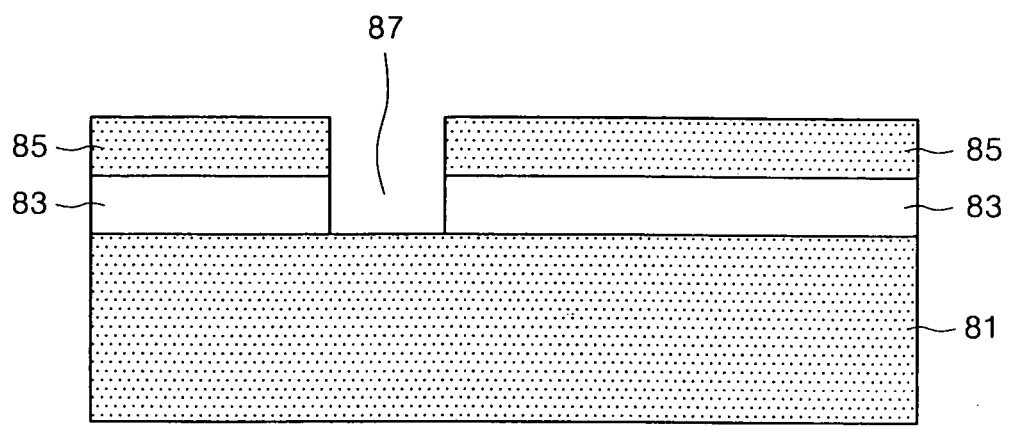

Referring to FIG. 16, the lower silicon layer 85 and the buried insulating layer 83 are sequentially patterned to form an opening 87 for exposing a predetermined region of the lower semiconductor substrate 81. The opening 87 may either be a groove having a line shape or a hole, as was described above with reference to FIG. 5 and FIG. 7.

Figure 17:
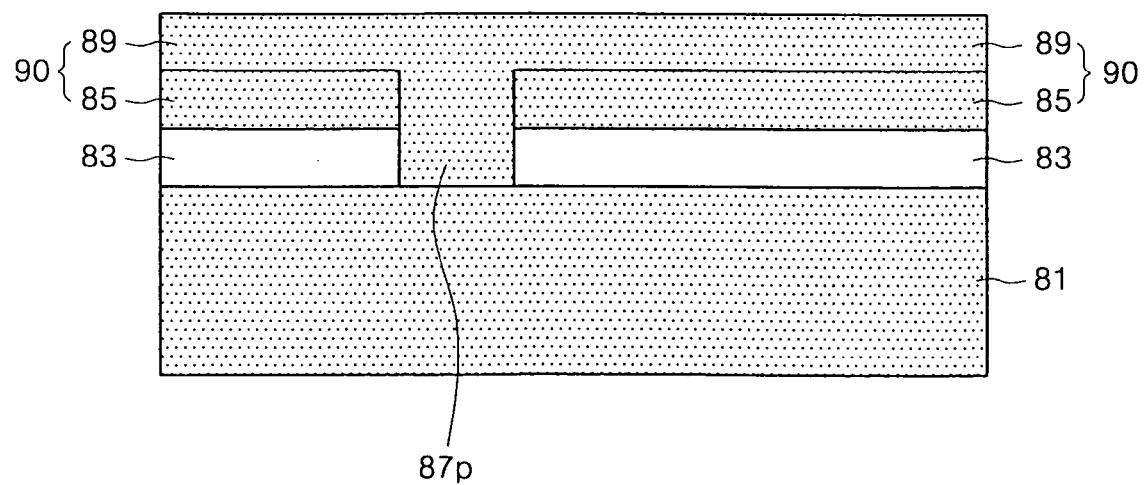

Referring to FIG. 17, an upper silicon epitaxial layer 89 is formed on the SOI substrate. The upper silicon epitaxial layer 89 fills the opening 87 that exposes the lower semiconductor substrate 81 and covers the upper surface of the lower silicon layer 85 to form a through plug 87p that fills the opening 87.

The silicon layers 85 and 89 formed on the buried insulating layer 83 are referred to as an upper silicon substrate 90. The upper silicon substrate 90 is electrically connected with the lower semiconductor substrate 81 via the through plug 87*p*.

Figure 18:
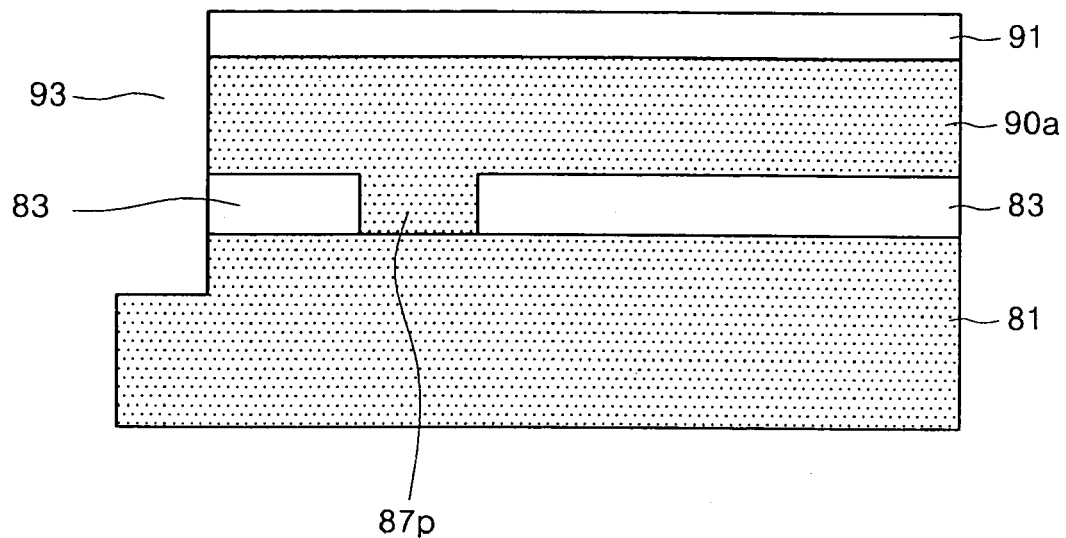

Referring to FIG. 18, the upper silicon substrate 90, the buried insulating layer 83, and the lower semiconductor substrate 81 are sequentially patterned to form a trench 93 for defining an active area of the lower semiconductor substrate 81. The active area includes at least some portion of the lower semiconductor substrate 81 exposed in the opening 87. An upper silicon pattern 90*a* is formed while the trench 93 is formed. In addition, the buried insulating layer 83 is exposed on the side wall of the trench 93.

Preferably, a hard mask pattern 91 may be used to form the trench 93. This hard mask pattern 91 is used as an etch mask to etch the upper silicon substrate 90, the buried insulating layer 83, and the lower semiconductor substrate 81, which results in the trench 93.

Figure 19:
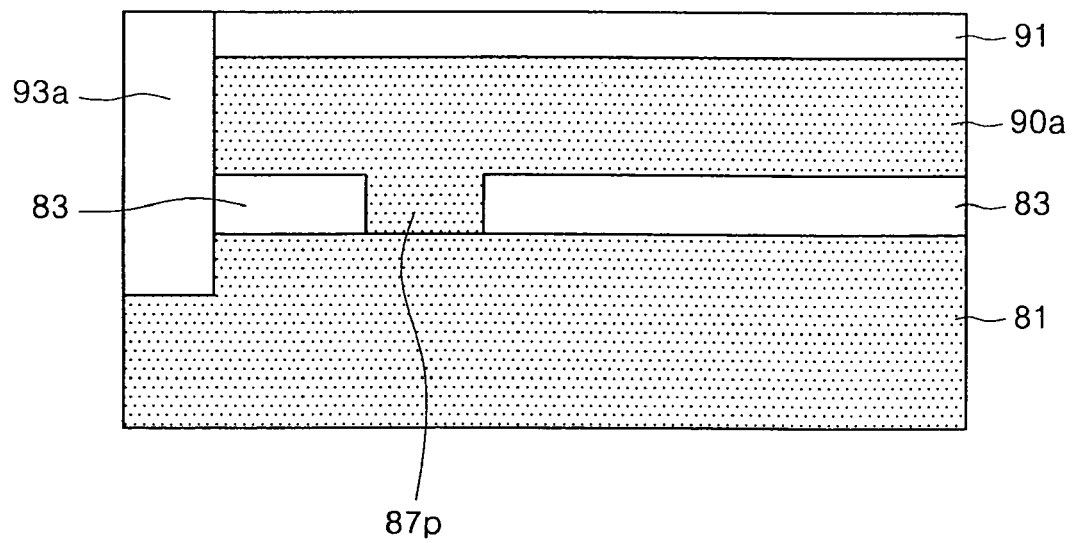

Referring to FIG. 19, an insulating layer that fills the trench 93 is formed on the SOI substrate. The insulating layer is then planarized until the upper surface of the hard mask pattern 91 is exposed to form a device isolation layer 93*a* that fills the trench 93. The device isolation layer 93*a* covers the side walls of the buried insulating layer 83 and the upper silicon pattern 90*a*. In this case, the hard mask pattern 91 acts to protect the upper surface of the upper silicon pattern 90*a*.

After the device isolation layer 93*a* is formed, the MOS transistor, the bit line, and the cell capacitor may be formed as was described above with reference to FIG. 12 to FIG. 14, which results in a DRAM cell having a SOI substrate that is capable of operating in the body-tied mode or the body-floated mode.

In accordance with some embodiments of the invention, a semiconductor device is provided that operates in the body-tied mode or the body-floated mode, thereby increasing the on-current and decreasing the off-current while improving the floating body effect. In accordance with other embodiments of the invention, a DRAM cell is provided that operates in the body-floated mode while information is being stored to enhance the refresh characteristics of the DRAM cell. In addition, the method for fabricating the semiconductor having two different operation modes and the DRAM cell may be provided.

The invention may be practiced in many ways. What follows are exemplary, non-limiting descriptions of some embodiments of the invention.

According to some embodiments of the invention, a semiconductor device having two different operation modes employs an asymmetrical buried insulating layer. The semiconductor device includes a lower semiconductor substrate having an active area. An upper silicon pattern and a MOS transistor are positioned above the active area of the lower semiconductor substrate. The MOS transistor includes a body region formed within the upper silicon pattern, source/drain regions spaced apart from each other and separated by the body region, and a gate electrode insulated from the upper silicon pattern and positioned on a surface of the body region. A buried insulating layer is interposed between the lower semiconductor substrate and the upper silicon pattern. A through plug that penetrates the buried insulating layer is positioned closer to one of the source/drain regions than the other and electrically connects the body region of the MOS transistor with the lower semiconductor substrate. In addition, at least some portion of an upper surface of the through plug is positioned outside a depletion layer when a source voltage is applied to the closer one of the source/drain regions, and the upper surface of the through plug is positioned inside the depletion layer when a drain voltage is applied to the closer one of the source/drain regions. As a result, the MOS transistor may operate in a body-tied mode or in a body-floated mode. When the MOS transistor operates in the body-floated mode, on-current may be increased and off-current may be decreased. In the meantime, when the MOS transistor operates in the body-floated mode, holes may accumulate in the body region. However, the accumulated holes may be removed when the MOS transistor operates in the body-tied mode. Thus, the MOS transistor may alternately operate in the body-tied mode and then the body-floated modes to improve the floating-body effect.

The lower semiconductor substrate, the upper silicon pattern, and the through plug may be the same single crystal silicones. In other words, they may be formed using the same single crystal silicon substrate. Preferably, the lower semiconductor substrate is single crystal silicon, and the upper silicon pattern and the through plug are silicon epitaxial layers. In other words, the lower semiconductor substrate is formed of the single crystal silicon, and the upper silicon pattern and the through plug are formed of the same silicon epitaxial layers.

The source/drain regions and the buried insulating layer may be separated from each other by the body region. In other words, neutral regions may be present between the source/drain regions and the buried insulating layer as in the case of partially-depleted SOI MOSFET (PDSOI MOSFET). In this case, the through plug may be disposed below either one of the source/drain regions. In other words, the through plug may be positioned below the one region to be significantly spaced from the gate electrode. As such, the through plug is positioned significantly apart from a junction edge where leak current is apt to occur, which leads to further reduction in the leakage current.

Alternatively, the source/drain regions and the buried insulating layer may be in contact with each other. In other words, there may be no neutral regions between the source/drain regions and the buried insulating layer as in the case of fully-depleted SOI MOSFET (FDSOI MOSFET).

According to other embodiments of the invention, there is provided a DRAM cell having two different operation modes that employs an asymmetrical buried insulating layer. The DRAM cell includes a lower semiconductor substrate having an active area. An upper silicon pattern and a MOS transistor are positioned above the active area of the lower semiconductor substrate. The MOS transistor includes a body region formed within the upper silicon pattern, source/drain regions spaced from each other by the body region, and a gate electrode insulated from the upper silicon pattern and positioned on a surface of the body region. A buried insulating layer is interposed between the lower semiconductor substrate and the upper silicon pattern. A through plug that penetrates the buried insulating layer is positioned close to one of the source/drain regions to electrically connect the body region of the MOS transistor with the lower semiconductor substrate. In addition, at least some portion of the upper surface of the through plug is positioned outside a depletion layer when a source voltage is applied to the closer one of the source/drain regions, and the upper surface of the through plug is positioned inside the depletion layer when a drain voltage is applied to the closer one of the source/drain regions. In the meantime, the cell capacitor is electrically connected with the closer one of the source/drain regions, and the bit line is electrically connected with the other source/drain region. As a result, the MOS transistor may operate in the body-tied mode or in the body-floated mode. The MOS transistor operates in the body-tied mode while it stores information in the cell capacitor, so that holes do not accumulate within the body region, improving the floating-body effect. When charges are stored in the cell capacitor, the MOS transistor operates in the body-floated mode. Thus, leakage current is prevented, improving the refresh characteristics while the charges are maintained.

According to still the embodiments of the invention, a method for fabricating a semiconductor device having two different operation modes employing an asymmetrical buried insulating layer includes forming a buried insulating layer and an upper silicon pattern that are sequentially stacked on an active area of a lower semiconductor substrate. The upper silicon pattern is electrically connected with the lower semiconductor substrate via a through plug that penetrates the buried insulating layer. In the meantime, a MOS transistor is formed on the upper silicon pattern to include a body region and source/drain regions separated from each other by the body region. The MOS transistor is positioned so that the through plug is closer to one of the source/drain regions. In addition, the MOS transistor is positioned to allow at least some portion of the upper surface of the through plug to be outside the depletion layer when a source voltage is applied to the closer one of the source/drain regions, and to allow the upper surface of the through plug to be inside the depletion layer when a drain voltage is applied to the closer one of the source/drain regions.

Preferably, the process of forming the buried insulating layer and the upper silicon pattern includes the process of forming a sacrificial layer on the lower semiconductor substrate. The sacrificial layer is patterned to form an opening for exposing the lower semiconductor substrate. An upper silicon epitaxial layer is formed on the lower semiconductor substrate having the opening to fill the opening and to cover the sacrificial layer. In this case, the opening is filled to form the through plug. The upper silicon epitaxial layer, the sacrificial layer, and the lower semiconductor substrate are patterned to form a trench for defining the active area within the lower semiconductor substrate. The active area includes at least some portion of the lower semiconductor substrate exposed by the opening. In addition, the patterned sacrificial layer is exposed by the side wall of the trench. The exposed patterned sacrificial layer is selectively removed, and an empty space where the patterned sacrificial layer is already removed is filled with an insulating layer. As a result, the buried insulating layer is interposed between the upper silicon pattern and the lower semiconductor substrate. The trench is then filled with the insulating layer to form a device isolation layer.

The sacrificial layer may be formed of material such as a SiGe epitaxial layer having a lattice constant that is close to that of the silicon. Preferably, the SiGe epitaxial layer may be formed to have a thickness of about 10 nm to 200 nm. A lower silicon epitaxial layer may be formed on the sacrificial layer.

The process of forming the MOS transistor may include the process of forming a gate electrode on the upper silicon pattern that is insulated from the upper silicon pattern. Impurity ions are implanted using the gate electrode as an ion implanting mask to form source/drain regions within the upper silicon pattern.

Preferably, channel ions may be implanted on the upper silicon pattern before the gate electrode is formed. These channel ions may be diffused by performing a thermal treatment on the upper silicon pattern where the channel ions were implanted. In this case, the channel ions are diffused via the through plug. As a result, a concentration of the channel ions within the body region above the through plug is less than a concentration within the body region above the buried insulating layer, so that the depletion layer may be readily adjusted near the source/drain region that is closest to the through plug.

The source/drain regions may be formed to be separated from the buried insulating layer by the body region. In other words, there may be neutral regions between the buried insulating layer and the source/drain regions as in the case of a partially depleted SOI MOSET (PDSOI MOSFET). In this case, any one of the source/drain regions is preferably positioned above the through plug.

Alternatively, the source/drain regions may be formed in contact with the buried insulating layer. In other words, there may be no neutral regions between the buried insulating layer and the source/drain regions as in the case of fully-depleted SOI MOSFET (FDSOI MOSFET).

While the present invention has been described with reference to numerous particular embodiments, it is understood that the disclosure has been made for purpose of illustrating the invention by way of examples and is not limited to limit the scope of the invention. One skilled in the art may make modifications and changes to the embodiments described above without departing from the scope and spirit of the invention as defined by the attached claims.

We claim:

1. A semiconductor device comprising:
a lower semiconductor substrate having an active region;
an upper silicon pattern positioned above the active region;
a MOS transistor including a body region within the upper silicon pattern, source/drain regions separated by the body region, and a gate electrode insulated from the upper silicon pattern and positioned on a surface of the body region;
a buried insulating layer between the lower semiconductor substrate and the upper silicon pattern; and
a through plug that penetrates the buried insulating layer and electrically connects the body region of the MOS transistor with the lower semiconductor substrate, the through plug being closer to one of the source/drain regions than another one of the source drain regions, an upper surface of the through plug outside a depletion layer when a source voltage is applied to the one of the source/drain regions, the upper surface of the through plug inside the depletion layer when a drain voltage is applied to the one of the source/drain regions.

2. The semiconductor device of claim 1, wherein the lower semiconductor substrate, the upper silicon pattern, and the through plug together consist of a single silicon crystal.

3. The semiconductor device of claim 1, wherein the lower semiconductor substrate consists of a single silicon crystal, and the upper silicon pattern and the through plug consist of silicon epitaxial layers.

4. The semiconductor device of claim 3, wherein the source/drain regions are separated from the buried insulating layer by the body region.

5. The semiconductor device of claim 4, wherein the through plug is arranged below the one of the source/drain regions.

6. The semiconductor device of claim 3, wherein the source/drain regions are in contact with the buried insulating layer.

7. The semiconductor device of claim 1, the upper surface of the through plug structured to be inside the depletion layer when the MOS transistor is operated in a body-floated mode.

8. The semiconductor device of claim 1, the upper surface of the through plug structured to be outside the depletion layer when the MOS transistor is operated in a body-tied mode.

9. The semiconductor device of claim 1, wherein an outermost perimeter of the through plug is defined by a plurality of sidewalls and wherein the through plug exists contiguously laterally between the plurality of sidewalls.

10. The semiconductor device of claim 1, further comprising a device isolation layer adjacent to the active region, wherein the upper surface of the through plug is between a top portion and a bottom portion of the device isolation layer.

11. The semiconductor device of claim 10, wherein a lower surface of the through plug is between the top and bottom portions of the device isolation layer.

12. The semiconductor device of claim 1, wherein the gate electrode at least partially overlaps the top surface of the through plug.

13. A DRAM cell comprising:
a lower semiconductor substrate having an active region;
an upper silicon pattern above the active region;
a MOS transistor including a body region within the upper silicon pattern, source/drain regions separated by the body region, and a gate electrode insulated from the upper silicon pattern and positioned on a surface of the body region;
a buried insulating layer between the lower semiconductor substrate and the upper silicon pattern;
a through plug that penetrates the buried insulating layer and electrically connects the body region of the MOS transistor with the lower semiconductor substrate, the through plug being closer to one of the source/drain regions than another one of the source drain regions, an upper surface of the through plug outside a depletion layer when a source voltage is applied to the one of the source/drain regions, the upper surface of the through plug inside the depletion layer when a drain voltage is applied to the one of the source/drain regions;
a cell capacitor electrically connected with the one of the source/drain regions; and
a bit line electrically connected with the another one of the source/drain regions.

14. The DRAM cell of claim 13, wherein the lower semiconductor substrate, the upper silicon pattern, and the through plug together consist of a single silicon crystal.

15. The DRAM cell of claim 13, wherein the lower semiconductor substrate consists of a single silicon crystal, and the upper silicon pattern and the through plug consist of silicon epitaxial layers.

16. The DRAM cell of claim 15, wherein the source/drain regions are separated from the buried insulating layer by the body region.

17. The DRAM cell of claim 16, wherein the through plug is positioned below the one of the source/drain regions.

18. The DRAM cell of claim 15, wherein the source/drain regions are in contact with the buried insulating layer.

19. The DRAM cell of claim 13, the upper surface of the through plug structured to be inside the depletion layer when the MOS transistor is operated in a body-floated mode.

20. The DRAM cell of claim 13, the upper surface of the through plug structured to be outside the depletion layer when the MOS transistor is operated in a body-tied mode.

21. The DRAM cell of claim 13, wherein an outermost perimeter of the through plug is defined by a plurality of sidewalls and wherein the through plug exists contiguously laterally between the plurality of sidewalls.

22. The DRAM cell of claim 13, further comprising a device isolation layer adjacent to the active region, wherein the upper surface of the through plug is between a top portion and a bottom portion of the device isolation layer.

23. The DRAM cell of claim 22, wherein a lower surface of the through plug is between the top and bottom portions of the device isolation layer.

24. The DRAM cell of claim 13, wherein the gate electrode at least partially overlaps the top surface of the through plug.

* * * * *